United States Patent
Behera et al.

(10) Patent No.: US 11,283,588 B1
(45) Date of Patent: Mar. 22, 2022

(54) FREQUENCY BIAS CORRECTION FOR CLOCK-DATA RECOVERY IN A SERIAL DATA CHANNEL

(71) Applicant: Marvell Asia Pte, Ltd., Singapore (SG)

(72) Inventors: Khitish Chandra Behera, Bangalore (IN); Seid Alireza Razavi Majomard, Belmont, CA (US); Ragnar Hlynur Jonsson, Aliso Viejo, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 17/248,753

(22) Filed: Feb. 5, 2021

Related U.S. Application Data

(60) Provisional application No. 62/971,267, filed on Feb. 7, 2020.

(51) Int. Cl.
*H04L 7/02* (2006.01)
*H04L 7/00* (2006.01)

(52) U.S. Cl.
CPC .............. *H04L 7/0016* (2013.01); *H04L 7/02* (2013.01)

(58) Field of Classification Search
CPC ....... H04L 7/0016; H04L 7/0079; H04L 7/02; H03L 7/08
See application file for complete search history.

(56) References Cited

U.S. PATENT DOCUMENTS

| | | | | |
|---|---|---|---|---|
| 8,537,957 | B2* | 9/2013 | Lesso | H03L 7/087 375/376 |
| 9,258,109 | B2* | 2/2016 | Francese | H04L 7/02 |
| 10,027,468 | B1* | 7/2018 | Li | H04L 7/0016 |

* cited by examiner

*Primary Examiner* — Betsy Deppe

(57) ABSTRACT

A physical layer transceiver for a serial data channel includes receiver circuitry having a local clock. Received signals arrive on the channel according to a remote clock. Clock-data recovery circuitry aligns the local clock with the remote clock by correcting phase and frequency error between the local and remote clocks. The clock-data recovery circuitry includes digital phase error detection circuitry operating according to a digital clock to detect phase error between the local and remote clocks, analog phase rotation circuitry to correct the detected phase error, distribution circuitry to divide the detected phase error into multiple phase error steps, and an analog clock source configured to provide the local clock to the analog phase rotation circuitry, and to provide to the distribution circuitry a distribution clock that is slower than the local clock, to correct the local clock by at least one step during one digital clock period.

23 Claims, 5 Drawing Sheets

FREQUENCY BIAS CORRECTION FOR CLOCK-DATA RECOVERY IN A SERIAL DATA CHANNEL

CROSS REFERENCE TO RELATED APPLICATIONS

This disclosure claims the benefit of commonly-assigned U.S. Provisional Patent Application No. 62/971,267, filed Feb. 7, 2020, which is hereby incorporated by reference herein in its entirety.

FIELD OF USE

This disclosure relates to the correction of frequency bias in clock-data recovery circuitry of a serial data channel. More particularly, this disclosure relates to increasing the amount of frequency bias that can be corrected in clock-data recovery circuitry of a serial data channel by breaking up the correction into a series of smaller corrections spread over time.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Receiver circuitry in physical layer (PHY) devices for serial communications typically include clock-data recovery (CDR) circuitry to align the phase and/or frequency of the clock of the receiver circuitry with the phase and/or frequency of the clock of a received signal. Typically, portions of the CDR circuitry are implemented in the digital domain, while other portions of the CDR circuitry are implemented in the analog domain. The digital portion of the CDR circuitry estimates the required phase and frequency correction, while the analog portion of the CDR circuitry performs the phase and frequency correction. The two domains are separately clocked, with the digital clock typically being slower than the analog clock. Because the digital portion estimates the required phase and frequency correction, the slower digital clock limits the speed of phase and frequency correction. And because the analog portion performs the phase and frequency correction, the accuracy of the phase and frequency correction is constrained by "overshoot" in the transient analog response. The overshoot effect increases as the magnitude of the correction increases. In other words, limits on the quality of the analog response results in limits on the magnitude of the phase and frequency correction that can be performed. However, in some applications, both speed and accuracy of the CDR phase and frequency correction are important.

SUMMARY

Implementations according to the subject matter of this disclosure of a physical layer transceiver for a serial data channel include receiver circuitry operating according to a local clock, the receiver circuitry being configured to receive signals that arrive on the serial data channel according to a remote clock, and clock-data recovery circuitry configured to align the local clock with the remote clock by correcting phase and frequency error between the local clock and the remote clock. The clock-data recovery circuitry includes digital phase error detection circuitry configured to operate according to a digital clock and to detect phase error between the local clock and the remote clock, analog phase rotation circuitry configured to correct the phase error detected by the digital phase error detection circuitry, distribution circuitry configured to divide the phase error detected by the digital phase error detection circuitry into a first number of phase error steps, each step being at most equal to the detected phase error, for correction by the analog phase rotation circuitry, and an analog clock source configured to provide the local clock to the analog phase rotation circuitry, and to provide to the distribution circuitry a distribution clock that is slower than the local clock and at least equal to the digital clock. The analog phase rotation circuitry is configured to correct the local clock by at least one phase error step out of the first number of phase error steps during one period of the digital clock.

In a first implementation of such a physical layer transceiver, the distribution clock may be at least equal to the digital clock multiplied by the first number, and the at least one phase error step out of the of the first number of phase error steps is the entirety of the first number of phase error steps.

In a second implementation of such a physical layer transceiver, the at least one phase error step out of the first number of phase error steps is fewer than the first number of phase error steps.

In a third implementation of such a physical layer transceiver, the analog clock source may include clock source circuitry configured to provide the local clock, and clock divider circuitry configured to divide the local clock to provide the distribution clock.

In a first instance of that third implementation, the distribution clock provided by the clock divider circuitry may be below a clock threshold at which the analog phase rotation circuitry experiences jitter.

In a second instance of that third implementation, the clock source circuitry may be a phase-locked loop.

In a fourth implementation of such a physical layer transceiver, the distribution circuitry may be configured to output a value indicating a phase angle.

In a first instance of that fourth implementation, the distribution circuitry may be configured to output a gray-coded value indicating a phase angle.

In a fifth implementation of such a physical layer transceiver, the distribution circuitry may include an accumulator configured to store an accumulated number indicating how many phase rotation steps are required to correct the phase error, a comparator configured to compare the accumulated number of required phase rotation steps to the detected phase error, and a selector configured to adjust the accumulated number of required phase rotation steps stored in the accumulator based on output of the comparator.

In a first instance of that fifth implementation, the selector may include a multiplexer configured to output an increment signal to the accumulator when output of the comparator indicates that the detected phase error exceeds the accumulated number of required phase rotation steps, output a decrement signal to the accumulator when the output of the comparator indicates that the detected phase error is less than the accumulated number of required phase rotation steps, and output a signal to the accumulator to maintain the accumulated number of required phase rotation steps when the output of the comparator indicates that the detected phase error is equal to the accumulated number of required phase rotation steps.

In a second instance of that fifth implementation, the comparator may be a difference engine.

In a third instance of that fifth implementation, the distribution circuitry may further include a binary-to-gray-code engine configured to convert binary output of the accumulator to gray-coded input to the analog phase rotation circuitry.

In implementations according to the subject matter of this disclosure of a clock-data recovery method for aligning a local clock, according to which receiver circuitry of a physical layer transceiver operates, with a remote clock according to which signals arrive to the receiver circuitry on a serial data channel, the clock-data recovery method corrects phase and frequency error between the local clock and the remote clock, and includes detecting the phase error between the local clock and the remote clock in a digital domain according to a digital clock, distributing the detected phase error between the local clock and the remote clock into a first number of phase error steps for correction, and phase-rotating the local clock, in an analog domain clocked by the local clock, according to a distribution clock that is slower than the local clock and at least equal to the digital clock, by at least one phase error step out of the first number of phase error steps during one period of the digital clock.

In a first implementation of such a method, the phase rotating may be performed according to the distribution clock which is at least equal to the digital clock multiplied by the first number, where the at least one phase error step out of the of the first number of phase error steps is the entirety of the first number of phase error steps.

In a second implementation of such a method, phase rotating the local clock may include applying fewer than the first number of phase error steps.

In a third implementation of such a method, the distribution clock may be provided by dividing the local clock.

In an instance of that third implementation, the distribution clock may be provided by dividing the local clock to a clock rate below a clock threshold at which analog phase rotation of the local clock experiences jitter.

In a fourth implementation of such a method, the distributing may include specifying a phase angle indicating a remaining number of phase error steps required for correction.

In an instance of that fourth implementation, the specifying may include specifying the phase angle as a gray-coded value.

In a fifth implementation of such a method, the distributing may include accumulating a number indicating how many phase rotation steps are required to correct the phase angle, comparing the accumulated number of required phase rotation steps to the detected phase error, and adjusting the accumulated number of required phase rotation steps based on the comparing.

In a first instance of that fifth implementation, the adjusting may include incrementing the accumulated number of required phase rotation steps when the comparing indicates that the detected phase error exceeds the accumulated number of required phase rotation steps, decrementing the accumulated number of required phase rotation steps when the comparing indicates that the detected phase error is less than the accumulated number of required phase rotation steps, and maintaining the accumulated number of required phase rotation steps when the comparing indicates that the detected phase error is equal to the accumulated number of required phase rotation steps.

In a second instance of that fifth implementation, the comparing may include taking a difference between the detected phase error and the accumulated number of required phase rotation steps.

In a third instance of that fifth implementation, the distributing may further include converting the accumulated number of required phase rotation steps to a gray-coded number.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
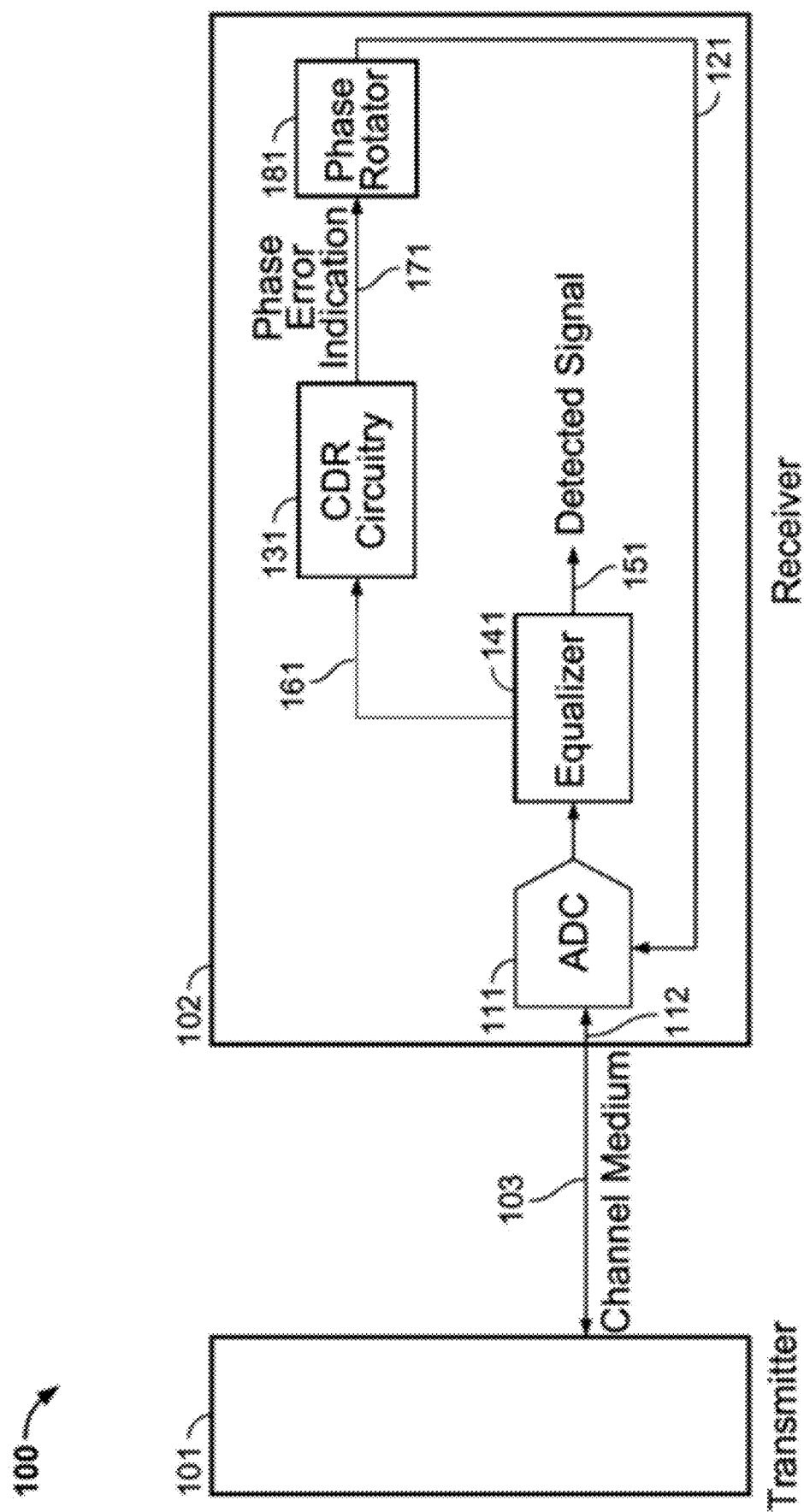
FIG. 1 shows a portion of a communication link in which implementations of the subject matter of this disclosure may be used.

As noted above, receiver circuitry in physical layer (PHY) devices for serial communications typically include clock-data recovery (CDR) circuitry to align the phase and/or frequency of the clock of the receiver circuitry with the phase and/or frequency of the derived clock of a received data signal. As used herein, and in the claims that follow, "data" refers to any digital information, other than clock information, in a signal. In particular, "data" may refer to user data, OAM (operations/administration/management) information, etc. Correction of phase and frequency may be achieved by detecting phase error and rotating the phase of the signal, which also adjusts the frequency of the signal. Accordingly, the discussion which follows will focus on detection and correction of phase error.

Typically, portions of the CDR circuitry are implemented in the digital domain, while other portions of the CDR circuitry are implemented in the analog domain. The digital portion of the CDR circuitry estimates the required phase correction, while the analog portion of the CDR circuitry performs the phase correction. The two domains normally are separately clocked, with the digital clock typically being slower than the analog clock.

The digital portion estimates the required phase correction. Therefore, the slower digital clock limits the speed of phase correction, because the correction cannot be performed before the error to be corrected has been determined.

The analog portion performs the phase correction. Therefore, the accuracy of the phase correction is constrained by the step response of the analog portion of the CDR circuitry, which may oscillate about the target value as it settles into that target value. The difference between the targeted value and the actual transient response of the analog portion of the CDR circuitry is proportional to the magnitude of the correction. Therefore, the amount of correction that can be performed is limited if significant difference is to be avoided.

The combined effect of digital detection speed limitations and analog correction magnitude limitations may be substantial. However, in some applications—particularly where real-time response is desirable, such as, e.g., in automotive Ethernet applications—both speed and accuracy of the CDR phase correction are important. Therefore, both the speed limitation on detection caused by the digital clock, and the magnitude limitation on correction caused by analog overshoot—and particularly the combined effect of those limitations on the amount of frequency bias that can be corrected by CDR—are unacceptable in such applications.

Therefore, in accordance with implementations of the subject matter of this disclosure, the maximum frequency bias that can be corrected by CDR is increased by distributing a phase correction measured in the digital domain into a plurality of smaller but more frequent phase corrections in the analog domain. Because the analog clock runs faster than the digital clock, the plurality of smaller analog phase corrections needed to correct the amount of phase error detected in one digital clock cycle can be completed before the next digital clock cycle, so the CDR process does not fall behind.

CDR typically is performed by a loop circuit. In accordance with implementations of the subject matter of this disclosure, a CDR loop circuit may be modified by adding an extra function block at the output of the digital portion of the CDR loop. The digital portion of a typical CDR loop outputs a digital value representing the amount of phase angle of the required correction. The extra function block distributes the phase correction determined by the digital portion of the CDR loop into a plurality of smaller, more frequent phase corrections in the analog domain.

Each of the smaller phase corrections is small enough, in these implementations, that transient error is minimal, if it occurs at all. Each plurality of smaller phase corrections derives from a single larger phase correction output at each cycle of the digital CDR clock. As in the case of typical CDR circuitry, the actual phase correction may be performed by a phase rotator based on an analog clock that runs faster than the digital CDR clock. When the analog clock is faster than the digital CDR clock, multiple small corrections can be completed before the next cycle of the digital CDR circuitry detects a new phase correction resulting in a new plurality of smaller phase corrections to be performed.

However, if the phase rotator receives inputs for phase correction too frequently, the phase rotator may be subject to jitter. Therefore, in accordance with implementations of the subject matter of this disclosure, the frequency with which phase corrections are input to the phase rotator is limited to below a threshold rate at which jitter is experienced. Limitation of the frequency with which phase corrections are input to the phase rotator may be accomplished, in accordance with implementations of the subject matter of this disclosure, by running the extra function block at a clock rate slower than the analog clock that clocks the phase rotator, which may or may not be the main analog clock of the analog clock domain of the CDR circuitry.

For example, a clock divider may be used to divide the source of analog clock of the CDR circuitry by an integer number. The source of the analog clock may be, in some implementations, a phase-locked loop or similar loop circuit (e.g., a delay-locked loop). The divided analog clock should be slower than the main analog clock and at least equal to the digital clock, so that at least one, and up to all, of the smaller corrections are completed within one digital clock cycle, before the digital circuitry outputs the next single larger phase correction.

In some implementations, as seen below, all of the smaller corrections may not completely follow the single larger corrections. For example, in some implementations, the size of one of the smaller corrections may be fixed (at a size determined to avoid analog overshoot), and the number of corrections of that size that can be performed within one digital clock cycle at the rate of the divided analog clock may not add up to the full larger correction output by the digital circuitry (e.g., because of the aforementioned jitter limitation on the divided analog clock rate). Nevertheless, the accumulated smaller corrections eventually converge on the required correction.

In some implementations, the extra function block includes an accumulator that stores a number indicating how many of the smaller corrections need to be performed to equal the single larger correction. A comparison circuit compares the accumulated value to the output of the digital error detection circuitry.

In some implementations, the accumulated value represents the number of steps, at a fixed smaller step size, needed to achieve the correction represented by the output of the digital error detection circuitry. In these implementations, if the output of the digital error detection circuitry is equal to the accumulated value, then the value in the accumulator is left unchanged. If the output of the digital error detection circuitry is greater than the accumulated value, then the value in the accumulator is decremented by one. If the output of the digital error detection circuitry is less than the accumulated value, then the value in the accumulator is incremented by one. The output is used to tell the phase rotator how many of the smaller phase rotation steps need to be performed.

As the reduced analog clock, which is at least as fast as the digital clock, runs during one digital clock cycle, the accumulator, which starts out at '0', is incremented on each cycle that the accumulated value does not equal the number of smaller phase correction steps needed to reach the single larger phase correction step. The value in the accumulator is fed back to the comparator, which may be a difference engine, providing the difference, in units of the number of smaller steps needed, between the output of the digital detection circuitry and the accumulator.

If the difference is '0', then the accumulator value is not changed. If the difference is positive, meaning there are more steps to be performed than indicated by the accumulator, then the value in the accumulator is incremented by '1' (it may take several cycles until the accumulator registers the correct value). If the difference is negative, meaning there are fewer steps to be performed than indicated by the accumulator, then the value in the accumulator is decremented by '1'.

Eventually, either the required number of smaller steps needed to achieve the larger phase correction are performed, or the next digital clock cycle is reached and a new phase correction value arrives. In the latter case, as many of the smaller phase corrections as could be performed will have been performed, but the full larger phase correction may not have been achieved during this cycle. However, corrections will have been accumulated in the right direction and in subsequent cycles, as noted below, the phase error correction will converge on the correct value.

The subject matter of this disclosure may be better understood by reference to FIGS. 1-5.

FIG. 1 shows a portion of a communication link 100 in which implementations of the subject matter of this disclosure may be used. Communication link 100 may include a transmitter 101 (which may be part of a first unseen physical layer transceiver, or PHY) and a receiver 102 (which may be part of a second unseen PHY), connected by a channel medium 103. Normally there would be a receiver co-located with transmitter 101 in the first PHY, and a transmitter co-located with receiver 102 in the second PHY, and channel medium 103 is bidirectional. The channel medium may be an air interface in a wireless application, but in other applications, the channel medium may be a cabled Ethernet connection such as an automotive Ethernet connection. The cabled connection may be a wired connection which is either a coaxial cable, a shielded twisted pair, or an unshielded twisted pair (UTP), or may be a fiber connection (in which case additional optical-to-electrical components, which are not shown, would be present in receiver 102, along with electrical-to-optical components in transmitter 101).

In receiver 102, a signal 112 received via channel medium 103 includes data with an inherent clock provided at remote transmitter 101. Signal 112 is digitized by analog-to-digital converter (ADC) 111, which is clocked by a clock signal 121 whose phase and/or frequency are recovered from signal 112 by CDR circuitry 131. The output of ADC 111 is processed in equalizer 141 to remove interference (e.g., from echo and/or crosstalk), providing detected signal 151. Path 161 provides the output of equalizer 141 as the CDR input to processed through phase error determination circuitry 201 (FIG. 2), to provide a phase error indication 171 that is at least partially corrected by phase rotator 181.

Figure 2:
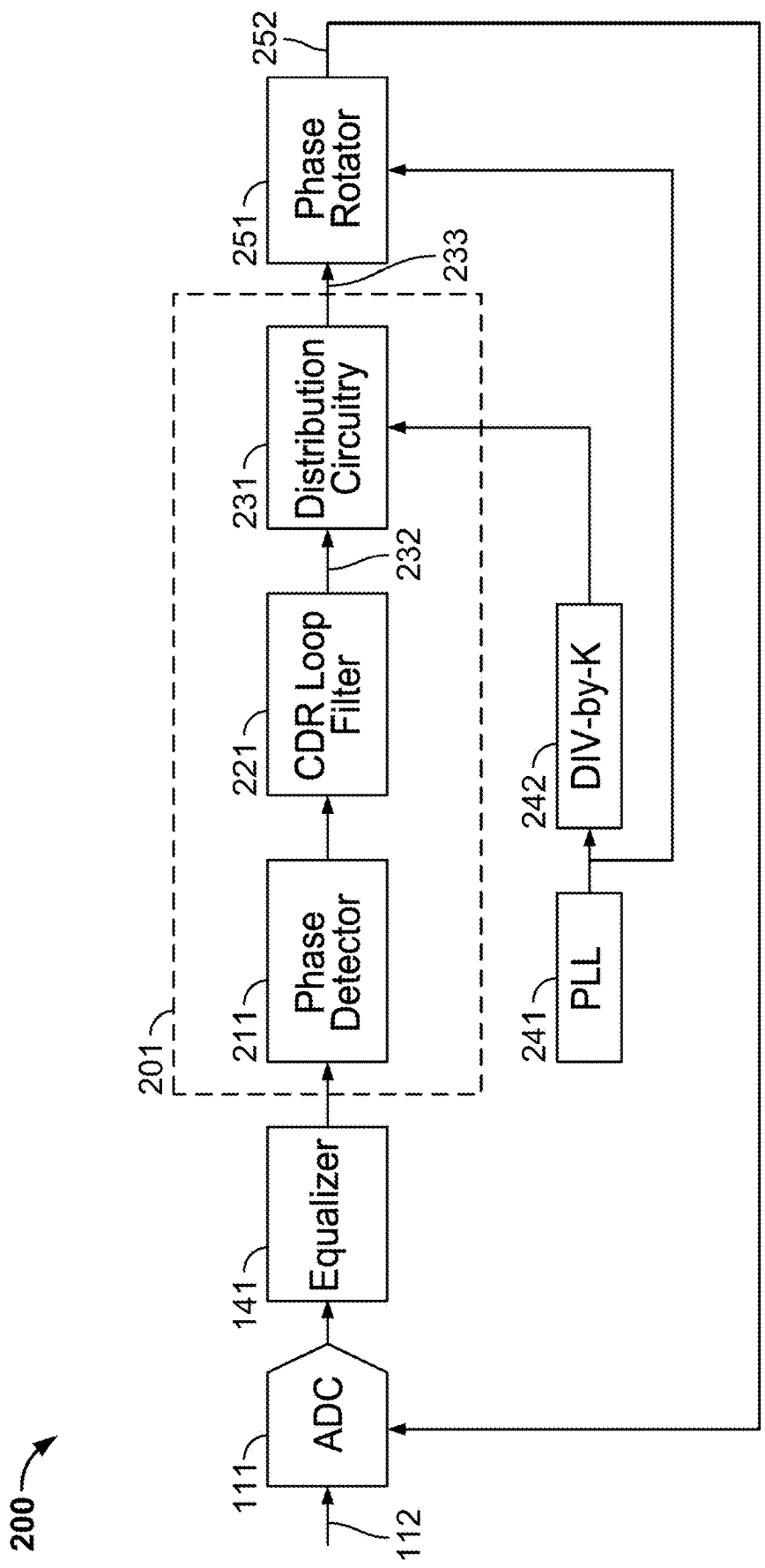
FIG. 2 shows an implementation of receiver circuitry in accordance with the subject matter of this disclosure.

FIG. 2 shows receiver circuitry 200 illustrating a receiver with CDR path 161. Input signal 112 is processed through ADC 111 and equalizer 141 and then passed to phase error determination circuitry 201. Phase error determination circuitry 201 operates in the digital domain and includes a digital phase detector 211, a digital CDR loop filter 221, and distribution circuitry 231 (shown in more detail in FIG. 3). Distribution circuitry 231 operates between the analog domain and the digital domain, being clocked by an output of the clock source 241 (a phase-locked loop as drawn here) that clocks the analog domain, divided down at 242 by an integer K.

Distribution circuitry 231 receives an input signal 232 from digital CDR loop filter 221. Signal 232 indicates the total amount of phase correction required to align the CDR output. Distribution circuitry 231 outputs a signal 233, which may be gray-coded to minimize errors during clock transitions, that indicates the amount of phase rotation to be performed by analog phase rotator 251. Phase-rotated clock signal 252 is fed back to clock ADC 111, and eventually converges on the clock of the incoming data signal 112.

Figure 3:
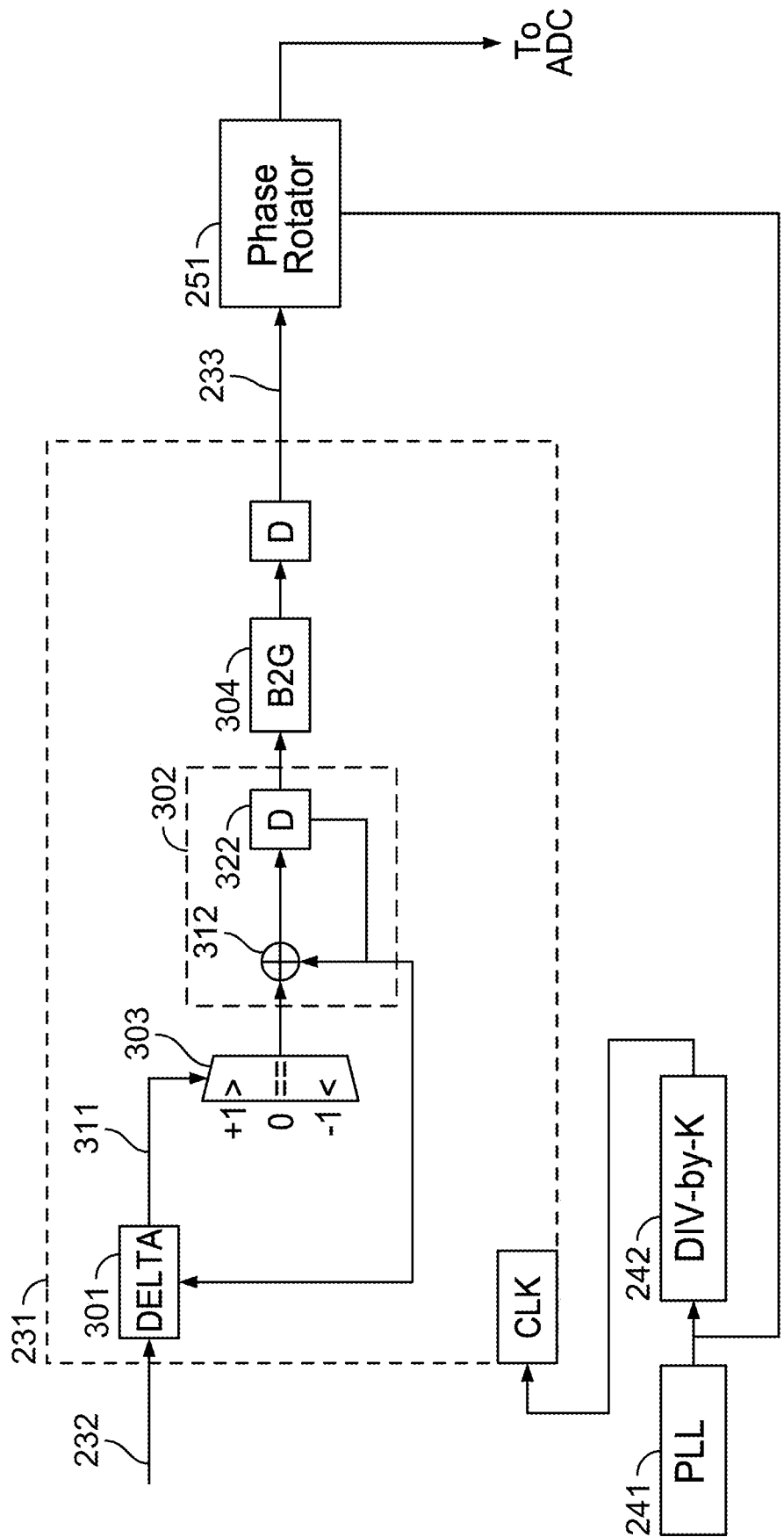
FIG. 3 shows details of an implementation of distribution circuitry in the received circuitry of FIG. 2.

As seen in FIG. 3, distribution circuitry 231 breaks the required correction indicated by signal 232 into smaller corrections 233, effectively distributing the correction by its least significant bits (LSBs) to analog phase rotator 251, with each LSB representing a fraction 1/n (e.g., ⅛) of a full phase rotation update. The fraction is determined by the magnitude of a full analog phase rotator step and the degree of analog transient error that would occur at the analog clock rate. Distribution circuitry 231 operates at a distribution clock rate that is 1/K times the full analog clock rate of analog phase rotator 251, where K is determined by the rate at which jitter would occur. Ideally, 1/K times the analog clock rate is equal to n times the digital clock rate, so that n small phase rotation steps, equal to one full phase rotation step, occur during one full clock period of digital CDR loop filter 221. However, as seen below, the distribution clock rate may be less than n times the digital clock rate, so that the total number of smaller phase rotation steps follows, but may not reach, the required total phase rotation. As the required phase rotation fluctuates, the accumulated phase rotation steps converge on the total required phase rotation.

As seen in FIG. 3, signal 232 is compared at comparator 301 to the value stored in accumulator 302 (adder 312 plus register 322 in a feedback relationship) which is initialized to 0. If signal 232 exceeds the value in accumulator 302, as indicated by comparator output 311, then value in accumulator 302 is incremented by '1' by selector/multiplexer 303. Signal 232 does not change until the next cycle of the digital clock of the digital portion of circuitry 201. Phase rotator 251 operates at the analog clock rate determined by phase-locked loop 241, which is many times the digital clock rate (and may or may not be the rate at which the remainder of the analog portion of receiver circuitry 200 operates). Even though circuitry 231 operates at 1/K times the PLL clock rate, that normally is still faster than the digital clock rate. However, circuitry 231 may operate at a rate as low as the digital clock rate.

Thus, if, for example, signal 232 indicates that a phase rotation value equal to three of the small phase rotation steps in the phase-increasing direction is needed, that value '3' will remain constant throughout one digital clock cycle. The input to comparator/difference engine 301 will remain constant at that value ('3' in this example). In the first divided analog clock cycle, no value will have been accumulated in accumulator 302 and therefore '3' will exceed '0' and '1' will be added to accumulator 302. On the next divided analog clock cycle, '3' will still exceed the '1' in accumulator 302 and so another '1' will be added to accumulator 302. On the next divided analog clock cycle, '3' will still exceed the '2' in accumulator 302 and so another '1' will be added to accumulator 302. Now the accumulated value is '3', and therefore on the next divided analog clock cycle, '3' will not exceed the '3' in accumulator 302 and so no further accumulation will occur until the next digital clock cycle when a new value 232 arrives, which may require further incrementing the accumulated value, or may require decrementing the accumulated value.

In the meantime, as the value in accumulator 302 has been increasing, that value has been passed to analog phase rotator 251. In some implementations, such as the one illustrated, the value is converted by binary-to-gray-code converter engine 304 to a gray-coded value, to minimize error during the value change as is well-known. Thus, on each cycle of the divided analog clock, phase rotator 251 will have increased the phase rotation by one of the small phase rotation steps, until the accumulated value stops increasing. If all of the required small phase rotation steps, as indicated by accumulator 302, have been implemented by phase rotator 251, then for the remainder of the current digital clock cycle, with no new value 232 input to comparator/difference engine 301, phase rotator 251 will stop rotating the phase angle When the next value 232 arrives, the accumulated value may increase further, requiring further phase rotation steps in the phase-increasing direction, or the accumulated value may decrease, requiring phase rotation steps in the decreasing direction. Thus, the accumulated value indicates the number and direction of required phase rotation steps.

Figure 4:
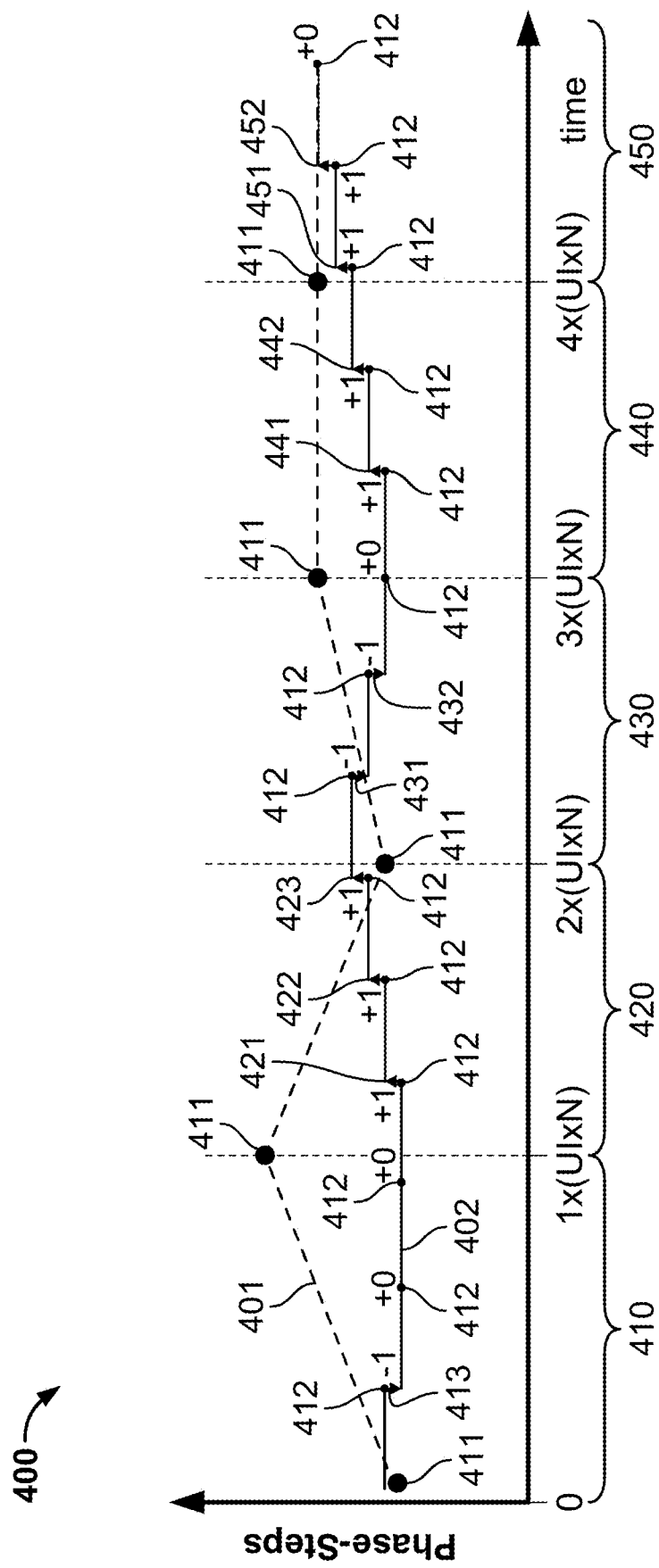
FIG. 4 is a graphical representation of the operation of distribution circuitry such as that shown in FIG. 3.

The operation of distribution circuitry 231 is illustrated by the graphical representation 400 in FIG. 4 where dashed line 401 represents the output of the digital CDR phase error detection circuitry, and solid line 402 represents the actual output of analog phase rotator 251. The abscissa represents time in unit intervals (UIs; i.e., periods) of the slower digital clock, while the ordinate represents numbers of phase rotation steps.

The target value in effect for each given UI is the value of the output 401 of the digital CDR phase error detection circuitry, as represented in FIG. 4 by the larger dot 411 at the beginning of each UI. The values achieved after the respective analog phase rotation steps along curve 402 are represented by the smaller dots 412. Each value 411 represents by a binary number output by the digital CDR phase error detection circuitry, and the change from one value 411 to the next value 411 represents a change in the least significant bits (LSBs) of the value. Thus each unit on the ordinate in FIG. 4 may be thought of as representing one of increment of phase rotation corresponding to one bit of the binary number representing the detected phase error, equivalent to one step height of the curve 402.

In the particular example illustrated in FIG. 4, it can be seen that approximately three individual phase rotation steps occur, according to the divided analog clock, PLL/K, during each UI of the slower digital clock. In the first UI 410, the initial value of the analog output phase is slightly above the digital target value 411 for that UI. Thus, one negative (decrease) analog phase rotation step occurs at 413 after one period of the divided analog clock. During the remaining two periods of the divided analog clock in that digital UI 410, no phase rotation occurs.

At the beginning of the second digital UI 420, the digital target phase value 411 has increased by approximately eight analog phase rotation steps. Because there are only three analog UIs during digital UI 420, only three analog phase rotation steps 421, 422, 423 occur during digital UI 420. Those steps are sufficient to achieve only ⅜ of the target increase. However, by the end of digital UI 420, the digital target phase value 411 for the following digital UI 430 has dropped by about seven analog phase rotation steps and thus the analog phase output needs to be decreased by two analog phase rotation steps during digital UI 430, which occurs at 431 and 432, with no change at the third analog UI of digital UI 430, which occurs on the boundary of the next digital UI 440.

At the beginning of the fourth digital UI 440, the digital target phase value 411 has increased by approximately four analog phase rotation steps. Thus the analog phase output needs to be increased by four analog phase rotation steps during digital UI 440. Only two analog UIs are completed within digital UI 440, and therefore only two of the needed four analog phase rotation step increases occur at 441 and 442. However, during digital UI 440, the digital target phase value does not increase, so that at the beginning of digital UI 450, there remain two unperformed analog phase rotation step increases from digital UI 440, which occur at 451 and 452, whereupon the actual phase has converged with the target phase and the CDR is aligned (until the next change).

As seen from the illustration in FIG. 4, the distribution clock may be slower than the multiple of the digital clock needed for all required analog phase rotation steps to be performed within on digital clock cycle. Nevertheless, after a number of digital clock cycles, the actual phase does converge with the target phase. Thus, it is sufficient that the distribution clock be at least equal to the digital clock, although convergence may occur faster if the distribution clock is a multiple of the digital clock.

Figure 5:
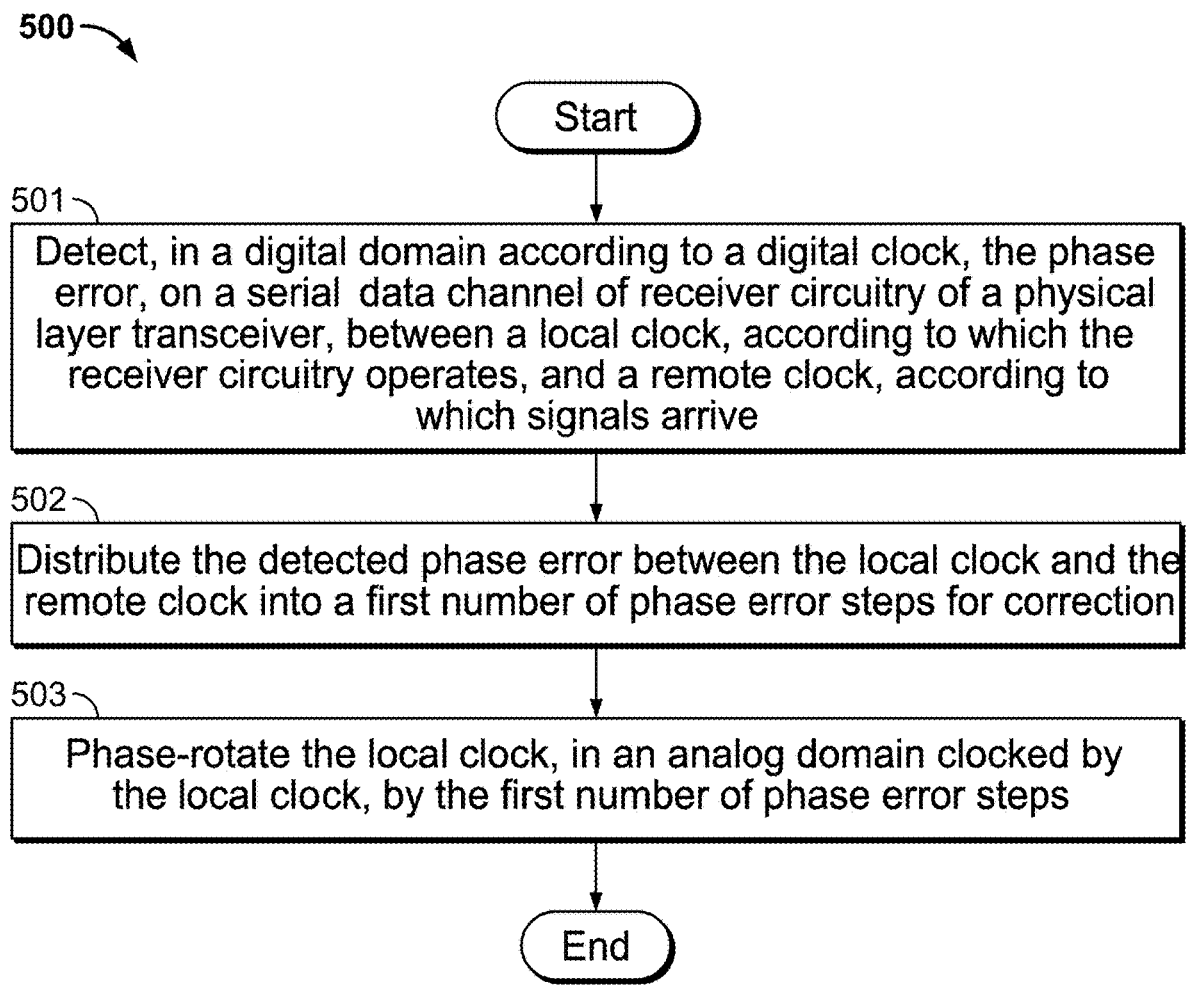
FIG. 5 is a flow diagram illustrating a method according to implementations of the subject matter of this disclosure.

A CDR method 500 according to implementations of the subject matter of this disclosure is diagrammed in FIG. 5. At 501, the phase error, on a serial data channel of receiver circuitry of a physical layer transceiver, between a local clock, according to which the receiver circuitry operates, and a remote clock, according to which signals arrive, is detected. At 502, the detected phase error between the local clock and the remote clock is distributed into a first number of phase error steps for correction. At 503, the local clock, in an analog domain clocked by the local clock, is phase-rotated by the first number of phase error steps, and method 500 ends.

Thus it is seen that a method and circuitry for clock-data recovery in a serial data channel, that increases the amount of phase error that can be corrected by breaking up the correction into a series of smaller corrections spread over time, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A physical layer transceiver for a serial data channel, the physical layer transceiver comprising:
   receiver circuitry operating according to a local clock, the receiver circuitry being configured to receive signals that arrive on the serial data channel according to a remote clock; and
   clock-data recovery circuitry configured to align the local clock with the remote clock by correcting phase and frequency error between the local clock and the remote clock, the clock-data recovery circuitry comprising:
   digital phase error detection circuitry configured to operate according to a digital clock and to detect phase error between the local clock and the remote clock,
   analog phase rotation circuitry configured to correct the phase error detected by the digital phase error detection circuitry,
   distribution circuitry configured to divide the phase error detected by the digital phase error detection circuitry into a first number of phase error steps, each step being at most equal to the detected phase error, for correction by the analog phase rotation circuitry, and
   an analog clock source configured to provide the local clock to the analog phase rotation circuitry, and to provide to the distribution circuitry a distribution clock that is slower than the local clock and at least equal to the digital clock, wherein the analog phase rotation circuitry is configured to correct the local clock by at least one phase error step out of the first number of phase error steps during one period of the digital clock.

2. The physical layer transceiver of claim 1 wherein:
   the distribution clock is at least equal to the digital clock multiplied by the first number; and
   the at least one phase error step out of the of the first number of phase error steps is the entirety of the first number of phase error steps.

3. The physical layer transceiver of claim 1 wherein the at least one phase error step out of the first number of phase error steps is fewer than the first number of phase error steps.

4. The physical layer transceiver of claim 1 wherein the analog clock source comprises:
   clock source circuitry configured to provide the local clock; and
   clock divider circuitry configured to divide the local clock to provide the distribution clock.

5. The physical layer transceiver of claim 4 wherein the distribution clock provided by the clock divider circuitry is below a clock threshold at which the analog phase rotation circuitry experiences jitter.

6. The physical layer transceiver of claim 4 wherein the clock source circuitry is a phase-locked loop.

7. The physical layer transceiver of claim 1 wherein the distribution circuitry is configured to output a value indicating a phase angle.

8. The physical layer transceiver of claim 1 wherein the distribution circuitry is configured to output a gray-coded value indicating a phase angle.

9. The physical layer transceiver of claim 1 wherein the distribution circuitry comprises:
   an accumulator configured to store an accumulated number indicating how many phase rotation steps are required to correct the phase error;
   a comparator configured to compare the accumulated number of required phase rotation steps to the detected phase error; and
   a selector configured to adjust the accumulated number of required phase rotation steps stored in the accumulator based on output of the comparator.

10. The physical layer transceiver of claim 9 wherein the selector comprises a multiplexer configured to:
   output an increment signal to the accumulator when output of the comparator indicates that the detected phase error exceeds the accumulated number of required phase rotation steps;
   output a decrement signal to the accumulator when the output of the comparator indicates that the detected phase error is less than the accumulated number of required phase rotation steps; and
   output a signal to the accumulator to maintain the accumulated number of required phase rotation steps when the output of the comparator indicates that the detected phase error is equal to the accumulated number of required phase rotation steps.

11. The physical layer transceiver of claim 9 wherein the comparator is a difference engine.

12. The physical layer transceiver of claim 9 wherein the distribution circuitry further comprises a binary-to-gray-code engine configured to convert a binary output of the accumulator to a gray-coded input to the analog phase rotation circuitry.

13. A clock-data recovery method for aligning a local clock, according to which receiver circuitry of a physical layer transceiver operates, with a remote clock according to which signals arrive to the receiver circuitry on a serial data channel, the clock-data recovery method correcting phase and frequency error between the local clock and the remote clock, and comprising:
   detecting the phase error between the local clock and the remote clock in a digital domain according to a digital clock;
   distributing the detected phase error between the local clock and the remote clock into a first number of phase error steps for correction; and
   phase-rotating the local clock, in an analog domain clocked by the local clock, according to a distribution clock that is slower than the local clock and at least equal to the digital clock, by at least one phase error step out of the first number of phase error steps during one period of the digital clock.

14. The method of claim 13 wherein the phase rotating is performed according to the distribution clock which is at least equal to the digital clock multiplied by the first number, wherein the at least one phase error step out of the of the first number of phase error steps is the entirety of the first number of phase error steps.

15. The method of claim 13 wherein the phase rotating the local clock comprises applying fewer than the first number of phase error steps.

16. The method of claim 13 wherein the distribution clock is provided by dividing the local clock.

17. The method of claim 16 wherein the distribution clock is provided by dividing the local clock to a clock rate below a clock threshold at which analog phase rotation of the local clock experiences jitter.

18. The method of claim 13 wherein the distributing comprises specifying a phase angle indicating a remaining number of phase error steps required for correction.

19. The method of claim 18 wherein the specifying comprises specifying the phase angle as a gray-coded value.

20. The method of claim 13 wherein the distributing comprises:
   accumulating a number indicating how many phase rotation steps are required to correct the phase angle;
   comparing the accumulated number of required phase rotation steps to the detected phase error; and
   adjusting the accumulated number of required phase rotation steps based on the comparing.

21. The method of claim 20 wherein the adjusting comprises:
   incrementing the accumulated number of required phase rotation steps when the comparing indicates that the detected phase error exceeds the accumulated number of required phase rotation steps;
   decrementing the accumulated number of required phase rotation steps when the comparing indicates that the detected phase error is less than the accumulated number of required phase rotation steps; and
   maintaining the accumulated number of required phase rotation steps when the comparing indicates that the detected phase error is equal to the accumulated number of required phase rotation steps.

22. The method of claim 20 wherein the comparing comprises taking a difference between the detected phase error and the accumulated number of required phase rotation steps.

23. The method of claim 20 wherein the distributing further comprises converting the accumulated number of required phase rotation steps to a gray-coded number.

* * * * *